(12) United States Patent
Naono

(10) Patent No.: US 9,960,339 B2
(45) Date of Patent: May 1, 2018

(54) PIEZOELECTRIC ACTUATOR

(71) Applicant: FUJIFILM Corporation, Tokyo (JP)

(72) Inventor: Takayuki Naono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days. days.

(21) Appl. No.: 15/684,497

(22) Filed: Aug. 23, 2017

(65) Prior Publication Data

US 2017/0352796 A1 Dec. 7, 2017

Related U.S. Application Data

(63) Continuation of application No. PCT/JP2016/000982, filed on Feb. 24, 2016.

(30) Foreign Application Priority Data

Feb. 27, 2015 (JP) .................................. 2015-037568

(51) Int. Cl.
*H01L 41/04* (2006.01)
*H01L 41/09* (2006.01)
(Continued)

(52) U.S. Cl.
CPC ........ *H01L 41/042* (2013.01); *H01L 41/0805* (2013.01); *H01L 41/09* (2013.01); *H01L 41/18* (2013.01); *H01L 41/316* (2013.01)

(58) Field of Classification Search
CPC ... H01L 41/042; H01L 41/0805; H01L 41/09; H01L 41/187; H01L 41/0926; B41J 2/14233
(Continued)

(56) References Cited

U.S. PATENT DOCUMENTS 8,562,112 B2 * 10/2013 Fujii .................... B41J 2/04581
347/68
2009/0058954 A1 * 3/2009 Arakawa .............. B41J 2/14233
347/68
(Continued)

FOREIGN PATENT DOCUMENTS

JP H09-182466 A 7/1997
JP 2004-180496 A 6/2004
(Continued)

OTHER PUBLICATIONS

International Search Report issued in PCT/JP2016/000982; dated Jul. 5, 2016.
Written Opinion issued in PCT/JP2016/000982; dated Jul. 5, 2016.

*Primary Examiner* — Bryan Gordon
(74) *Attorney, Agent, or Firm* — Studebaker & Brackett PC

(57) ABSTRACT

A piezoelectric actuator includes a piezoelectric element that includes a piezoelectric unit including a ferroelectric, which has an asymmetric bipolar P-E curve, a capacitor connected to the piezoelectric unit in series, and a resistor connected to the capacitor in series and connected to the ferroelectric in parallel; and a drive unit that inputs a drive waveform Vd, which includes a DC offset component of which polarity is opposite to polarization of the ferroelectric, to the piezoelectric element to drive the piezoelectric element. A value of a coercive electric field $Ec_1$, a value of a coercive electric field $Ec_2$, the capacitance $C_s$ of the capacitor, the capacitance $C_{pz}$ of the ferroelectric, combined resistance $R_p$ of the resistance of the resistor and the resistance of the ferroelectric, and a fundamental angular frequency $\omega$ of the drive waveform satisfy Expressions I to III, wherein (Continued)

$$1/3 \leq |Ec_1 + Ec_2|/|Ec_1 - Ec_2| \qquad \text{Expression I}$$

$$C_s \geq 1.5\left(C_{pz} + \frac{1}{\omega R_p}\right) \qquad \text{Expression II}$$

$$R_p \geq -\frac{15}{C_s + C_{pz}} \cdot \frac{1}{\ln\left(\frac{0.5(C_s + C_{pz})}{C_s}\right)}. \qquad \text{Expression III}$$

9 Claims, 9 Drawing Sheets

(51) Int. Cl.
   *H01L 41/316* (2013.01)
   *H01L 41/08* (2006.01)
   *H01L 41/18* (2006.01)

(58) Field of Classification Search
   USPC .................................. 310/317, 330; 347/68
   See application file for complete search history.

(56) References Cited

U.S. PATENT DOCUMENTS

| | | | |
|---|---|---|---|
| 2009/0062114 A1* | 3/2009 | Arakawa | B41J 2/14233 502/232 |
| 2010/0277524 A1* | 11/2010 | Morita | B41J 2/0451 347/9 |
| 2011/0006243 A1* | 1/2011 | Sasaki | C23C 14/0036 252/62.9 PZ |
| 2011/0074888 A1* | 3/2011 | Fujii | B41J 2/04581 347/68 |
| 2011/0156537 A1* | 6/2011 | Fujii | B81C 1/00976 310/330 |
| 2015/0194591 A1 | 7/2015 | Fujii | |
| 2015/0229238 A1* | 8/2015 | Hirose | H01L 41/1873 318/116 |

FOREIGN PATENT DOCUMENTS

| JP | 2005-123421 A | 5/2005 |
| JP | 2008-252071 A | 10/2008 |
| JP | 2010-087144 A | 4/2010 |
| JP | 2011-078203 A | 4/2011 |
| JP | 2014-060330 A | 4/2014 |

* cited by examiner

PIEZOELECTRIC ACTUATOR

CROSS-REFERENCE TO RELATED APPLICATIONS

This application is a continuation application of International Application No. PCT/JP2016/000982 filed Feb. 24, 2016, which claims priority under 35 U.S.C. § 119(a) to Japanese Patent Application No. 2015-037568, filed Feb. 27, 2015. Each of the above applications is hereby expressly incorporated by reference, in its entirety, into the present application.

BACKGROUND OF THE INVENTION

1. Field of the Invention

The present invention relates to a piezoelectric actuator that includes a ferroelectric having asymmetric bipolar polarization-electric field hysteresis characteristics.

2. Description of the Related Art

Since a piezoelectric actuator has merits that the power consumption of the piezoelectric actuator is lower than the power consumption of other types of actuators and a drive circuit of the piezoelectric actuator is simpler than drive circuits of other types of actuators, the piezoelectric actuator comes into wide use. Among piezoelectric bodies, a ferroelectric typified by $BaTiO_3$ or $PbTiZrO_3$ (hereinafter, abbreviated as PZT) has large piezoelectric displacement but polarization is reversed and a displacement direction is reversed in a case in which an electric field exceeding a coercive electric field is applied to the ferroelectric. Since a drive integrated circuit (IC), which outputs a positive voltage, is standardized in terms of a design, a ferroelectric is generally subjected to polarization treatment (polling) in a positive direction and a positive unipolar voltage waveform is generally output from the drive IC to drive the ferroelectric. However, piezoelectric bodies, which have superiority or inferiority in terms of piezoelectric performance in a certain polarization direction, are present among piezoelectric bodies particularly having the form of a thin film, and a polar direction in which excellent performance of the piezoelectric body is derived does not necessarily correspond to the drive polarity of the drive IC.

For example, a Nb-added PZT thin film, which is formed by a sputtering method, has a polarization direction immediately after the formation of the film, and is preferentially orientated so as to have a negative polarity, and the Nb-added PZT thin film, which has an approximately double piezoelectric constant of a PZT thin film as compared to a case in which Nb is not added, is known.

A bipolar polarization-electric field curve (hereinafter, abbreviated as P-E hysteresis) of a ferroelectric film, which is preferentially orientated so as to have a negative polarity as in the case of the Nb-added PZT thin film formed by a sputtering method, is biased to a positive electric field side, that is, is asymmetric with respect to a y axis, and the absolute values of two coercive electric fields $Ec_-$ and $Ec_+$ of the bipolar polarization-electric field curve are different from each other ($|Ec_-|\neq|Ec_+|$). Since a ferroelectric film having the P-E hysteresis characteristics does not require polarization treatment and can obtain a large amount of displacement with a low voltage, the ferroelectric film is suitable for a micro electro mechanical system (MEMS) actuator device (T. Fujii et. al., Solid State Communications 149 (2009) 1799_1802). However, such a ferroelectric film generates very large displacement by the application of a small negative voltage in negative driving, but a large amount of displacement is not obtained even though a positive voltage, which has an absolute value equal to an applied negative voltage, is applied to the ferroelectric film at a positive voltage that is the polarity of a standard drive IC. That is, performance as an actuator cannot be sufficiently derived in a standard drive IC.

JP2005-123421A discloses a piezoelectric element including a piezoelectric film which has polarization in one direction immediately after the formation of the film and of which both two coercive electric fields of P-E hysteresis are biased to any one side of a positive side and a negative side at a bias ratio of 1/3 or more. JP2005-123421A discloses the piezoelectric element that keeps the linearity of the amount of displacement and the linearity of electric field intensity and has a sufficient piezoelectric property in the range of a low electric field since the spontaneous polarization of the piezoelectric film is stable so that it is difficult for the spontaneous polarization to be reversed in an external electric field and an increase in the amount of displacement caused by the rotation of a domain is not generated. On the other hand, to sufficiently derive performance in the piezoelectric film, the piezoelectric element needs to be driven with a voltage having the same polarity as spontaneous polarization as in the case of the Nb-added PZT thin film.

JP2008-252071A discloses that a piezoelectric element including a PZT ferroelectric film, which is preferentially orientated so as to have a negative polarity while a material, which is easily patterned, is used as the material of a lower electrode, the lower electrode is used as an address electrode, and an upper electrode is used as a ground electrode, can be driven by a drive IC having a positive polarity. Generally, a piezoelectric element is driven while one electrode of upper and lower electrodes is used as a ground electrode of which an applied voltage is fixed to 0 V, and the other electrode thereof is used as an address electrode of which an applied voltage is changed. From the perspective of easy drive and the easiness of a manufacturing process, the piezoelectric element is driven while the lower electrode is used as a ground electrode and an upper electrode is used as an address electrode.

Further, JP2010-87144A discloses a PZT ferroelectric film of which the amount of lead is controlled to make a bias of P-E hysteresis of the piezoelectric film to the positive side approach a negative side and a high piezoelectric property is obtained by a drive IC having a positive polarity.

SUMMARY OF THE INVENTION

According to the structure of a piezoelectric element disclosed in JP2008-252071A, a piezoelectric film, which has asymmetric hysteresis, that is, of which polarization is preferentially orientated so as to have a positive or negative polarity, can be driven in a polar direction in which a piezoelectric property is excellent. However, a process for manufacturing a piezoelectric element disclosed in JP2008-252071A is complicated in that a step of patterning a lower electrode is required in a step of manufacturing the piezoelectric element disclosed in JP2008-252071A.

Further, in JP2010-87144A, the amount of lead of the PZT ferroelectric film is controlled to move a polarity to a positive polarity from a negative polarity so that the improvement of the piezoelectric property in positive driving is succeeded. However, since the instability of polarization of the film produced by this technique is increased, there is a possibility that a phenomenon in which the polarization of the piezoelectric film is gradually reversed may occur in a case in which the film is to be driven with a voltage waveform including a voltage close to a coercive electric field in order to obtain a high piezoelectric property.

JP2004-180496A discloses a piezoelectric element of which long-term stability of the amount of displacement can be ensured in a case in which the piezoelectric element is driven with a voltage or less corresponding to a value that is obtained by multiplying a coercive electric field by 0.4 in order to suppress a phenomenon in which the polarization of a piezoelectric film is gradually reversed with the drive of the piezoelectric film. However, since it is difficult for a large amount of displacement as an actuator to be obtained in the driving within the range of a voltage, the required performance of a device cannot be satisfied.

The invention has been made in consideration of the above-mentioned circumstances, and an object of the invention is to provide a piezoelectric actuator that includes a ferroelectric having asymmetric bipolar polarization-electric field hysteresis characteristics and having polarization opposite to the polarity of a drive waveform and can obtain a large amount of displacement since being capable of being driven with a large voltage while suppressing a polarization reversal phenomenon.

A piezoelectric actuator of the invention comprises: a piezoelectric element that includes a piezoelectric unit including a ferroelectric, which has asymmetric bipolar polarization-electric field hysteresis characteristics having two coercive electric field points and having different absolute values of the two coercive electric fields, a capacitor electrically connected to the piezoelectric unit in series, and a resistor electrically connected to the capacitor in series and electrically connected to the ferroelectric in parallel; and a drive unit that inputs a drive waveform, which includes a DC offset component of which polarity is opposite to polarization of the ferroelectric, to the piezoelectric element to drive the piezoelectric element.

A value of a coercive electric field $Ec_1$, of which an absolute value is larger, of the two coercive electric fields and a value of a coercive electric field $Ec_2$, of which an absolute value is smaller, thereof satisfy Expression I; and capacitance $C_s$ of the capacitor, capacitance $C_{pz}$ of the ferroelectric, combined resistance $R_p$ of resistance of the resistor and resistance of the ferroelectric, and a fundamental angular frequency $\omega$ of the drive waveform satisfy Expression II and Expression III.

$$1/3 \leq |Ec_1 + Ec_2|/|Ec_1 - Ec_2| \quad \text{Expression I}$$

$$C_s \geq 1.5\left(C_{pz} + \frac{1}{\omega R_p}\right) \quad \text{Expression II}$$

$$R_p \geq -\frac{15}{C_s + C_{pz}} \cdot \frac{1}{\ln\left(\frac{0.5(C_s + C_{pz})}{C_s}\right)} \quad \text{Expression III}$$

In this specification, "having asymmetric bipolar polarization-electric field hysteresis characteristics" means that bipolar polarization-electric field hysteresis is asymmetric with respect to a y axis representing a polarization value.

The piezoelectric actuator of the invention is suitable in the case of the ferroelectric of which the polarity of the coercive electric field, of which the absolute value is larger, of the two coercive electric fields of the ferroelectric is positive.

Further, the piezoelectric actuator of the invention is suitable in a case in which the ferroelectric is a thin film formed on a substrate, a case in which the ferroelectric is a thin film that is formed on the substrate by a sputtering method using plasma, and a case in which the ferroelectric is a thin film spontaneously polarized immediately after the formation of the film.

The thin film, which is spontaneously polarized immediately after the formation of the film, means that the displacement of the thin film, which is obtained in a case in which the thin film is driven with an electric field of 17 kV/cm immediately after the formation of the film, is 70% or more of the displacement of the thin film which is obtained in a case in which the thin film is driven with an electric field of 17 kV/cm again after being driven with an electric field of 34 kV/cm.

It is preferable that the ferroelectric is one or two or more kinds of perovskite oxides expressed by General Formula P1, it is more preferable that the ferroelectric is one or two or more kinds of perovskite oxides expressed by General Formula P2, and it is still more preferable that the M in General Formula P2 includes Nb and a molar ratio Nb/(Zr+Ti+M) of Nb in a B-site element is in the range of 0.06 to 0.40.

$$ABO_3 \quad \text{General Formula P1}$$

(In General Formula P1. A is an A-site element including at least one kind of an element selected from the group consisting of Pb, Ba, Sr, Bi, Li, Na, Ca, Cd, Mg, K, and a lanthanide element, and B is a B-site element including at least one kind of an element selected from the group consisting of Ti, Zr, V, Nb, Ta, Sb, Cr, Mo, W, Mn, Mg, Sc, Co, Cu, In, Sn, Ga, Zn, Cd, Fe, Ni, Hf, and Al.)

$$A(Zr_x,Ti_y,M_{1-x-y})O_3 \quad \text{General Formula P2}$$

(In General Formula P2, A is an A-site element including Pb as a main component, M is a B-site element including at least one kind of an element selected from the group consisting of V, Nb, Ta, Sb, Cr, Mo, W, Mn, Mg, Sc, Co, Cu, In, Sn, Ga, Zn, Cd, Fe, Ni, Hf, and Al, and "0<x<1" and "0<y<1" are satisfied.) In this specification, "main component" means a component of which the content is 80 mole % or more.

In General Formula P1 and General Formula P2, a molar ratio of the A-site element, the B-site element, and oxygen is 1:1:3 as a standard but may deviate from 1:1:3 in a range in which a perovskite structure is obtained.

It is preferable that a gradient $\partial P/\partial E_{E=Ec_1}$ of the coercive electric field $Ec_1$ of the bipolar polarization-electric field hysteresis of the ferroelectric and a gradient $\partial P/\partial E_{E=0}$, which is obtained in a case in which electric field intensity is 0 V/cm, satisfy Expression IV. P denotes the polarization value of the bipolar polarization-electric field hysteresis. $E_{E=Ec_1}$ denotes electric field intensity of the coercive electric field $Ec_1$, and $E_{E=0}$ denotes electric field intensity in a case in which electric field intensity is 0 V/cm.

$$6.5 \leq \left(\frac{\partial P}{\partial E_{E=Ec_1}}\right) \bigg/ \left(\frac{\partial P}{\partial E_{E=0}}\right) \quad \text{Expression IV}$$

A piezoelectric actuator of the invention includes: a piezoelectric element that includes a piezoelectric unit including a ferroelectric, which has asymmetric bipolar polarization-electric field hysteresis characteristics having two coercive electric field points, having different absolute values of the two coercive electric fields, and satisfying Expression I, a capacitor connected to the piezoelectric unit in series, and a resistor connected to the capacitor in series and connected to the ferroelectric in parallel; and a drive unit that inputs a drive waveform, which includes a DC offset component of which polarity is opposite to polarization of the ferroelectric, to the piezoelectric element to drive the piezoelectric element. According to this structure, since the piezoelectric unit can be driven with a bipolar voltage waveform from which the DC offset component has been removed from the drive waveform that includes the DC offset component of which the polarity is opposite to the polarization of the ferroelectric, it is possible to obtain a large amount of displacement by using the piezoelectric property of the polarity side of a drive waveform and excellent piezoelectric property of the polarization polarity side of the ferroelectric together. Further, since the impedance of the ferroelectric is rapidly reduced near the coercive electric field, a divided voltage of a drive waveform applied to the ferroelectric is automatically reduced near the coercive electric field by the capacitor connected in series. Accordingly, even though a voltage close to the coercive electric field is applied to the piezoelectric body of the piezoelectric actuator of the invention, the piezoelectric actuator of the invention can be driven in a state in which the polarization reversal of the ferroelectric is suppressed. According to the invention, since displacement deterioration caused by depolarization during long-term driving is improved, it is possible to provide a piezoelectric actuator in which a large amount of displacement and long-term stability are compatible.

Furthermore, in the piezoelectric actuator of the invention, capacitance $C_s$ of the capacitor, capacitance $C_{pz}$ of the ferroelectric, combined resistance $R_p$ of resistance of the parallel resistor and resistance of the ferroelectric, and a fundamental angular frequency ω of the drive waveform satisfy Expression II and Expression III. According to this structure, it is possible to maintain 60% or more of a voltage of the drive waveform as a voltage to be applied to the ferroelectric and to remove the DC offset component in a time having high practicality. Accordingly, at a drive voltage having high practicality and time required for driving, a large amount of displacement and long-term stability having been described above can be compatible in the piezoelectric actuator of the invention.

DESCRIPTION OF THE PREFERRED EMBODIMENTS

[Piezoelectric Actuator]

Figure 1:
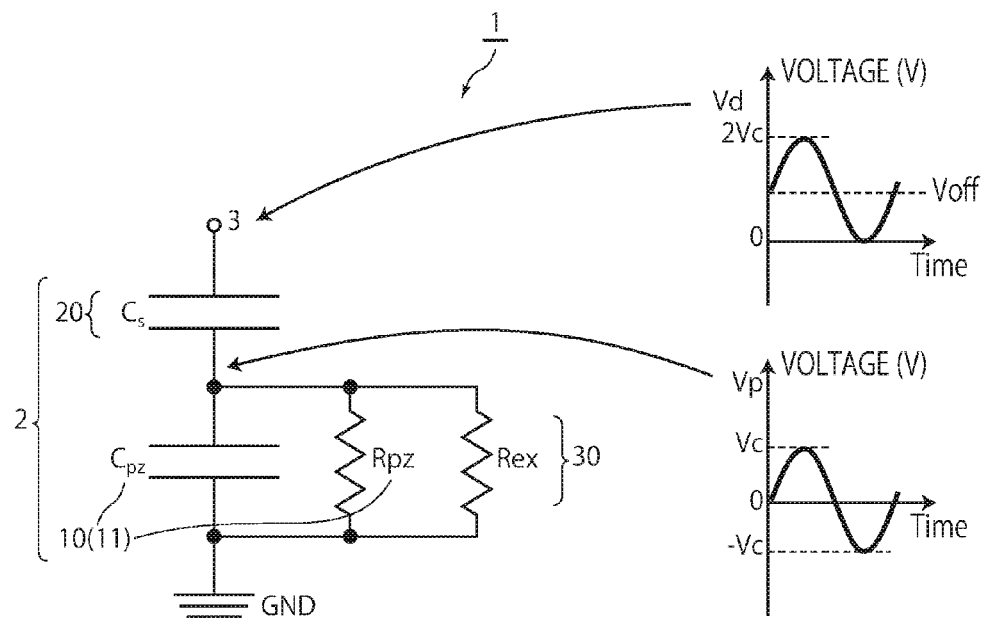
FIG. 1 is an equivalent circuit diagram showing the configuration of a piezoelectric actuator of an embodiment of the invention.

A piezoelectric actuator of an embodiment of the invention will be described with reference to drawings. FIG. 1 is an equivalent circuit diagram showing the configuration of the piezoelectric actuator.

As shown in FIG. 1, the piezoelectric actuator 1 includes: a piezoelectric element 2 that includes a piezoelectric unit 10 including a ferroelectric 11, which has asymmetric bipolar P-E hysteresis characteristics having two coercive electric field points, having different absolute values of two coercive electric fields, and satisfying Expression I, a capacitor 20 electrically connected to the piezoelectric unit 10 in series, and a resistor 30 electrically connected to the capacitor 20 in series and electrically connected to the ferroelectric 11 in parallel; and a drive unit 3 that inputs a drive waveform Vd, which includes DC offset components of which the polarities are opposite to the polarization of the ferroelectric 11, to the piezoelectric element 2 to drive the piezoelectric element 2.

$$\tfrac{1}{3} \le |Ec_1 + Ec_2|/|Ec_1 - Ec_2| \qquad \text{Expression I}$$

In Expression I, $Ec_1$ denotes a coercive electric field value of which the absolute value is larger and $Ec_2$ denotes a coercive electric field value of which the absolute value is smaller.

Further, in the piezoelectric actuator 1, the capacitance $C_s$ of the capacitor 20, the capacitance $C_{pz}$ of the ferroelectric 11, the combined resistance value $R_p$ of the resistance of the resistor 30 and the resistance of the ferroelectric 11, and the fundamental angular frequency ω of a drive waveform satisfy Expression II and Expression III.

$$C_s \geq 1.5\left(C_{pz} + \frac{1}{\omega R_p}\right) \qquad \text{Expression II}$$

$$R_p \geq -\frac{15}{C_s + C_{pz}} \cdot \frac{1}{\ln\left(\frac{0.5(C_s + C_{pz})}{C_s}\right)} \qquad \text{Expression III}$$

The piezoelectric unit 10 includes a pair of electrodes and the ferroelectric 11 interposed between the pair of electrodes. In FIG. 1, the piezoelectric unit 10 (the ferroelectric 11) is shown as a circuit which is an equivalent circuit and in which the capacitance $C_{pz}$ and the resistance value Rpz are connected to each other in parallel, and combined resistance (Rpz·Rex)/(Rpz+Rex) of Rpz and the resistance value Rex of the resistor 30 is combined resistance $R_p$.

The inventor earnestly examined a structure for achieving an object of a piezoelectric actuator that can be driven while suppressing a polarization reversal phenomenon up to a voltage near a coercive electric field and can obtain a large amount of displacement in a piezoelectric actuator that includes a ferroelectric having asymmetric bipolar polarization-electric field hysteresis characteristics satisfying Expression I and having polarization opposite to the polarity of a drive waveform. As a result, the inventor found a structure for achieving the object by using the property of a capacitor that stores electric charges having DC components and makes AC components flow and the permittivity of the ferroelectric, that is to say, a property in which impedance changes according to the gradient of P-E hysteresis; and completed the invention.

Expression I represents that two coercive electric fields of the bipolar P-E hysteresis of the ferroelectric 11 are biased to any one side of a positive side and a negative side at a bias ratio of 1/3 or more. The piezoelectric actuator 1 drives a piezoelectric element, which includes a ferroelectric having this asymmetric bipolar P-E hysteresis, by a drive waveform Vd that includes DC offset components of which the polarities are opposite to the polarization of the ferroelectric.

In a case in which the drive waveform Vd is input to the piezoelectric element 2 in the configuration shown in FIG. 1, DC components of the drive waveform Vd input to the capacitor 20 flow in the resistor 30 first. Then, the capacitor 20 is charged with electric charges, so that a difference in potential is generated when a predetermined time has passed.

The capacitor 20 is not charged with AC components. Accordingly, when charging time $t_s$ has passed, a bipolar drive waveform from which DC components have been removed, that is, from which polarity-side bias components of the drive waveform have been removed as shown in FIG. 1 is applied to the capacitor 20 and the piezoelectric unit 10 with divided voltages corresponding to ratios of the capacitance $C_s$ of the capacitor 20 and the combined impedance of the ferroelectric 11 and the parallel resistor 30.

Accordingly, according to the piezoelectric actuator 1, since the piezoelectric unit 10 can be driven with a bipolar voltage waveform from which DC offset components have been removed from the drive waveform Vd that includes DC offset components of which the polarities are opposite to the polarization of the ferroelectric 11, it is possible to obtain a large amount of displacement by using the piezoelectric property of the polarity side of a drive waveform and excellent piezoelectric property of the polarization polarity side of the ferroelectric 11 together.

Figure 2:
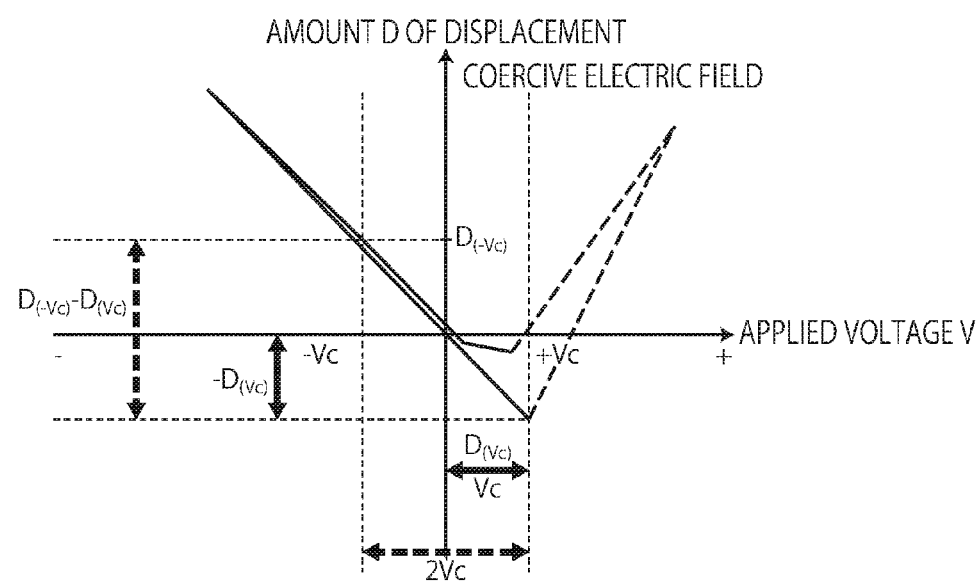
FIG. 2 is a diagram showing bipolar displacement-voltage hysteresis representing a drive voltage range of the piezoelectric actuator of the invention and an example of obtained displacement.

FIG. 2 is a diagram showing a drive voltage range of the piezoelectric actuator 1 and an example of obtained displacement in the bipolar displacement-voltage hysteresis of a ferroelectric film used in Example 1 to be described below. In FIG. 2, in regard to a piezoelectric actuator in the related art not including the capacitor 20 and the resistor 30, that is, shown in FIG. 5 of Comparative Example to be described below, even though the piezoelectric actuator is barely driven with a positive coercive electric field Vc in a case in which the piezoelectric actuator is driven by a drive waveform having a positive polarity, the range of a voltage to be applied is the range of 0 to +Vc and the amount of displacement D to be obtained is $-D_{(vc)}$. Further, according to the piezoelectric actuator 1, even though a drive waveform having a positive polarity is input, a voltage waveform to be applied to the ferroelectric is a bipolar waveform shown in FIG. 1 that is not offset. Accordingly, the range of a drive voltage to be input is the range of 0 to +2Vc and the amount of displacement D to be obtained is $D_{(-vc)}-D_{(vc)}$. Therefore, about double the displacement in the related art is obtained.

Figure 3:
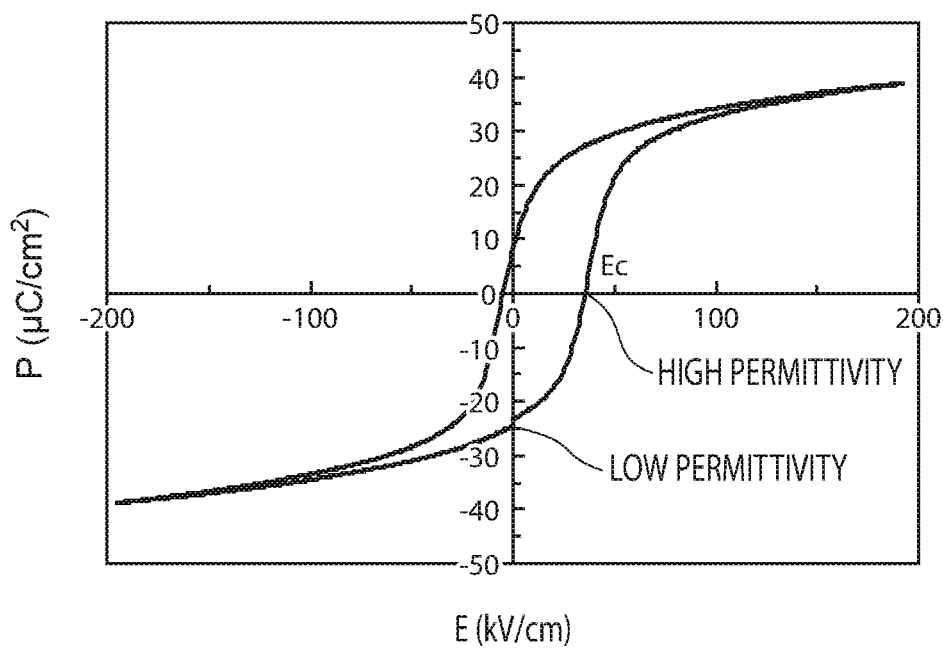
FIG. 3 is a diagram showing an example of asymmetric bipolar polarization-electric field hysteresis.

Furthermore, as described above, in the piezoelectric actuator 1, a bipolar drive waveform from which polarity-side bias components of the drive waveform Vd have been removed is applied to the capacitor 20 and the ferroelectric 11 (the piezoelectric unit 10) with divided voltages corresponding to ratios of the impedance of the capacitor 20 and the impedance of the ferroelectric 11. The impedance of a normal capacitor is substantially constant with respect to a voltage without depending on a voltage, but the impedance of a ferroelectric is inversely proportional to the permittivity of the ferroelectric and is reduced with an increase in the gradient ∂P/∂E of bipolar P-E hysteresis. FIG. 3 is a diagram showing the bipolar polarization-electric field hysteresis of the ferroelectric film used in Example 1 to be described below, but shows that the gradient ∂P/∂E of P-E hysteresis rapidly increases near a coercive electric field Ec. Accordingly, near the coercive electric field, a reduction in the impedance of the ferroelectric becomes rapidly significant and the voltage drop of the capacitor 20 is increased, so that a divided voltage of the drive waveform to be applied to the ferroelectric 11 is automatically reduced. Therefore, since a voltage to be applied to the ferroelectric is automatically reduced even though a voltage close to the coercive electric field is applied to the piezoelectric actuator 1 at the time of drive of the piezoelectric actuator 1, the piezoelectric actuator 1 can be driven in a state in which the polarization reversal of the ferroelectric occurring near the coercive electric field is suppressed. Accordingly, displacement deterioration caused by depolarization during long-term driving is improved, so that a large amount of displacement and long-term stability are compatible.

In regard to an effect of suppressing displacement deterioration caused by the depolarization, an effect of suppressing depolarization near the coercive electric field can be improved (see Example to be described below) since the capacitance of a ferroelectric, which has high squareness of P-E hysteresis and is formed so that the gradient $\partial P/\partial E_{E=Ec1}$ of the coercive electric field $Ec_1$ of the bipolar P-E hysteresis and the gradient $\partial P/\partial E_{E=0}$, which is obtained in a case in which electric field intensity is 0 V/cm, satisfy Expression IV, at a voltage distant from the coercive electric field is small and only the capacitance thereof near the coercive electric field is large.

$$6.5 \le \left(\frac{\partial P}{\partial E_{E=Ec1}}\right) / \left(\frac{\partial P}{\partial E_{E=0}}\right) \quad \text{Expression IV}$$

When a PZT-based perovskite oxide film to be described below is formed by a sputtering method so as to have a composition containing a large amount of Nb to be doped, the ferroelectric, which has high squareness and is formed so as to satisfy Expression IV, can be realized. However, in addition to this, even in a case in which a crystal structure is made to have a tetragonal structure and is orientated so that a c-axis is parallel to a thickness direction, the ferroelectric, which has high squareness and is formed so as to satisfy Expression IV, can be realized (Sensors and Actuators A 163 (2010) 220-225). Further, even in a case in which MgO and the like is used for a substrate and a single-crystal PZT thin film is epitaxially grown, the ferroelectric, which has high squareness and is formed so as to satisfy Expression IV, can be realized (JOURNAL OF APPLIED PHYSICS 98, 094106_2005_).

Furthermore, in the piezoelectric actuator 1, the capacitance $C_s$ of the capacitor 20, the capacitance $C_{pz}$ of the ferroelectric 11, the combined resistance value $R_p$ of the resistance of the resistor 30 and the resistance of the ferroelectric 11, and the fundamental angular frequency ω of a drive waveform satisfy Expression II and Expression III.

Expression II and Expression III are to define the ranges of the capacitance $C_s$ of the capacitor 20 and the resistance value Rex of the resistor 30 in which a large amount of displacement and long-term stability having been described above are compatible at a drive voltage having high practicality and time required for driving.

Since the impedance of the capacitor 20 is reduced as the capacitance $C_s$ of the capacitor 20 is increased, a divided voltage applied to the ferroelectric 11 can be increased. From the perspective of high-efficiency driving and considering a drive waveform having high practicality, it is preferable that a ratio of a voltage, which is to be applied to the ferroelectric, to a voltage of a drive waveform is high. Accordingly, it is preferable that the capacitance $C_s$ is large. On the other hand, in a case in which the capacitance Cs is too large, much time is taken to change the capacitor 20 with electric charges, that is, much time is taken to remove DC components.

In a case in which a ratio of a voltage, which is to be applied to the piezoelectric unit 10, to a voltage of the drive waveform Vd is denoted by a and a ratio of a voltage, which is to be applied to the capacitor 20, to the voltage of the drive waveform Vd is denoted by 1−α, a relationship between the impedance of the piezoelectric unit 10 and the impedance of the capacitor 20, in a case in which a ratio of a voltage to be applied to the piezoelectric unit 10 to a voltage of the drive waveform Vd is made to be equal to or higher than a, can be expressed by Expression II-0 using the capacitance $C_s$ of the capacitor 20, the capacitance $C_{pz}$ of the piezoelectric unit 10, the combined resistance value $R_p$ of the resistance of the resistor 30 and the resistance of the piezoelectric unit 10, and the angular frequency ω.

$$C_s \ge \frac{\alpha}{1-\alpha}\left(C_{pz} + \frac{1}{\omega R_p}\right) \quad \text{Expression II-0}$$

Further, in a case in which time, which is required to charge the capacitor 20 by a half of the capacitance $C_s$ of the capacitor 20, is made to be equal to or shorter than $t_s$, a relationship between the capacitance $C_s$ of the capacitor 20, the capacitance $C_{pz}$ of the ferroelectric 11, and the combined resistance value $R_p$ of the resistance of the resistor 30 and the resistance of the piezoelectric unit 10 can be expressed by Expression III-0.

$$R_p \ge -\frac{t_s}{C_s + C_{pz}} \cdot \frac{1}{\ln\left(\frac{0.5(C_s + C_{pz})}{C_s}\right)} \quad \text{Expression III-0}$$

The inventors thinks that a large amount of displacement and long-term stability having been described above are compatible while driving having high practicality is maintained in a case in which α of Expression II-0 is set to 0.6, that is, 60% or more of a voltage of the drive waveform is applied to ferroelectric 11 and $t_s$ is set to 15 seconds, that is, the charging time of the capacitor 20 is set to 30 seconds or less.

A case in which α of Expression II-0 is set to 0.6 corresponds to Expression II, and a case in which $t_s$ of Expression III-0 is set to 15 corresponds to Expression III.

As described above, the piezoelectric actuator 1 can maintain 60% or more of a voltage of the drive waveform as a voltage to be applied to the ferroelectric 11 and can remove DC offset components in a practical time. Accordingly, displacement deterioration caused by depolarization during long-term driving is improved at a drive voltage having high practicality and time required for driving, so that a large amount of displacement and long-term stability are compatible in the piezoelectric actuator 1.

It is preferable that the ferroelectric 11 of the piezoelectric actuator 1 is preferably one or two or more kinds of perovskite oxides expressed by General Formula P1, it is more preferable that the ferroelectric 11 of the piezoelectric actuator 1 is one or two or more kinds of perovskite oxides expressed by General Formula P2, and it is still more preferable that M of General Formula P2 includes Nb and the molar ratio Nb/(Zr+Ti+M) of Nb in a B-site element is in the range of 0.06 to 0.40.

Further, the ferroelectric 11 is a thin film formed on a substrate, and it is preferable that the ferroelectric 11 is a thin film formed by a sputtering method using plasma.

One or two or more kinds of perovskite oxides expressed by General Formula P2, particularly, M of General Formula P2 is a perovskite oxide which includes Nb and of which the molar ratio Nb/(Zr+Ti+M) of Nb in a B-site element is in the range of 0.06 to 0.40; and the ferroelectric, which is a thin film formed on a substrate, preferably, a thin film formed by a sputtering method using plasma, has P-E hysteresis significantly biased to the positive side and is orientated well so as to have a spontaneous polarization axis having a negative polarity immediately after the formation of the film. Accordingly, the ferroelectric is suitable as the ferroelectric of the piezoelectric actuator 1 (see Example to be described below).

 ABO<sub>3</sub>　　　　　　　　　　　　　General Formula P1

(In General Formula P1, A is an A-site element including at least one kind of an element selected from the group consisting of Pb, Ba, Sr, Bi, Li, Na, Ca, Cd, Mg, K, and a lanthanide element, and B is a B-site element including at least one kind of an element selected from the group consisting of Ti, Zr, V, Nb, Ta, Sb, Cr, Mo, W, Mn, Mg, Sc, Co, Cu, In, Sn, Ga, Zn. Cd, Fe, Ni, Hf, and Al.)

$$A(Zr_x,Ti_y,M_{1-x-y})O_3 \quad \text{General Formula P2}$$

(In General Formula P2, A is an A-site element including Pb as a main component, M is a B-site element including at least one kind of an element selected from the group consisting of V, Nb, Ta, Sb, Cr, Mo, W, Mn, Mg, Sc, Co, Cu, In, Sn, Ga, Zn, Cd, Fe, Ni, Hf, and Al, and "0<x<1" and "0<y<1" are satisfied.)

In General Formula P1 and General Formula P2, a molar ratio of the A-site element, the B-site element, and oxygen is 1:1:3 as a standard but may deviate from 1:1:3 in a range in which a perovskite structure is obtained.

Since the perovskite oxide expressed by General Formula P1 or P2 is an insulator, Rpz also depends on crystallinity but is generally high, that is, 10 GΩ or more. For this reason, combined resistance $R_p$ is substantially equal to Rex in many cases.

Since a voltage from which DC components of a drive waveform have been removed is applied to the ferroelectric in the piezoelectric actuator 1 as described above, a DC bias voltage is not applied to the ferroelectric 11 and it is difficult to perform polarization treatment. Accordingly, the use of a ferroelectric film, which is spontaneously polarized immediately after the formation of the film as described above, is suitable in that polarization treatment is not necessary.

In a case in which the ferroelectric 11 is a ferroelectric film formed on a substrate, it is preferable that the capacitor 20 is also formed from a dielectric thin film (in the following, a "dielectric film") directly formed on the piezoelectric unit 10. Further, it is preferable that a resistor is a thin film formed so as to be electrically in parallel with the piezoelectric unit 10 and formed by patterning using a semiconductor processing technique so as to have a resistance value satisfying Expression II and Expression III. According to this aspect, the piezoelectric element 2 of the piezoelectric actuator 1 can be formed in a lump by a thin-film forming technique and a lithography technique. Since an external electronic component does not need to be used in a case in which a technique for forming an element in a lump is used, a device can be significantly reduced in size. The structure of the piezoelectric element 2, which is formed in a lump by a thin-film forming technique and a lithography technique, and a process for manufacturing the piezoelectric element 2 will be described below.

Figure 4A:
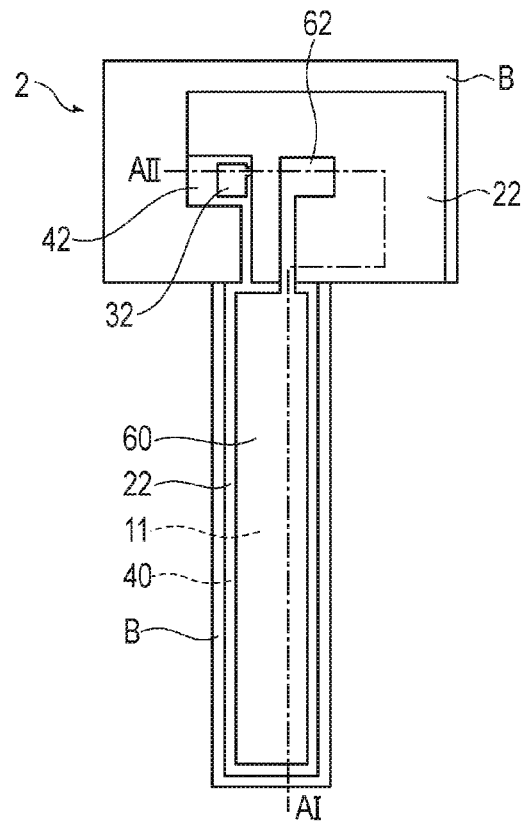
FIG. 4A is a top view showing an embodiment of a piezoelectric element of the piezoelectric actuator of the invention.
Figure 4B:
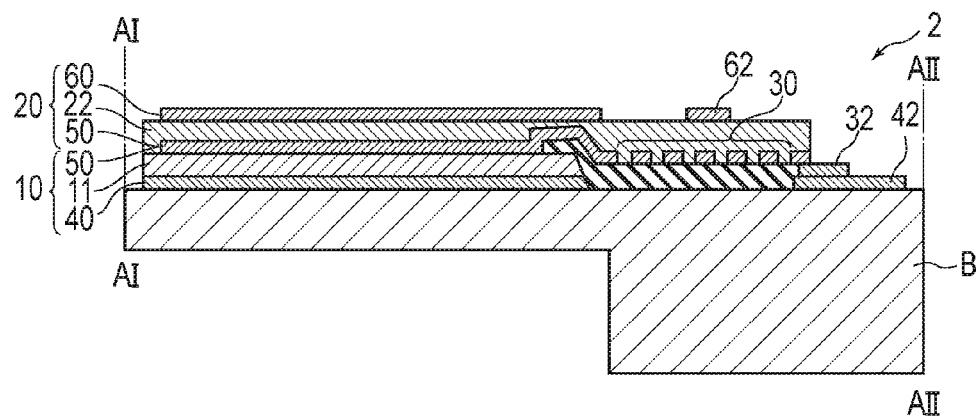
FIG. 4B is a schematic cross-sectional structural view taken along line AI-AII of the top view shown in FIG. 4A.
Figure 4C:
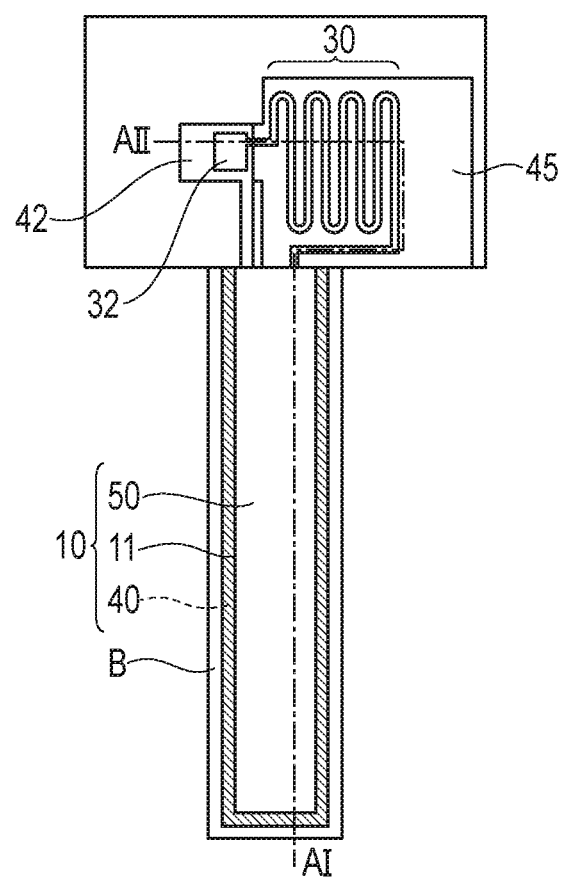
FIG. 4C is a top view showing, in progress, a step of manufacturing the piezoelectric element shown in FIG. 4A.

FIG. 4A is a top view of the piezoelectric element 2 that is formed in a lump by a thin-film forming technique and a lithography technique, and FIG. 4B is a schematic cross-sectional view taken along line AI-AII of FIG. 4A. Further, FIG. 4C is a top view during a step of manufacturing the piezoelectric element 2 after forming the piezoelectric unit and the resistor. Further, FIGS. 5A to 5G are cross-sectional views showing main steps of manufacturing the piezoelectric element 2 shown in FIGS. 4A and 4B (cross-section along line AI-AII of FIG. 4A). In FIGS. 4A to 4C and FIGS. 5A to 5G, the scale of each component is made to be appropriately different from the actual scale for easy visual recognition.

As shown in FIGS. 4A and 4B, the piezoelectric element 2 includes: a cantilever structure formed by layering, in order, a lower electrode 40, a ferroelectric thin film (in the following, referred to as a "ferroelectric film 11"), a piezoelectric unit upper electrode 50, a dielectric film 22, and a capacitor upper electrode 60, on a substrate B; and a base end section provided with a resistor 30, which is formed by patterning in a meandering shape, and respective electrode pads.

The substrate B is not particularly limited, and examples of the substrate B include substrates made of silicon, oxide silicon, stainless steel (SUS), yttrium-stabilized zirconia (YSZ), alumina, sapphire, SiC. SrTiO₃, and the like. A laminated substrate, such as a SOI substrate in which a SiO₂ film and a Si active layer are sequentially stacked on a silicon substrate, may be used as the substrate B. Further, in the case of the structure of FIG. 4A, the substrate B needs to be an insulator or the surface of the substrate B needs to be covered with an insulating film. Accordingly, wiring formed by patterning in a meandering shape functions as a thin-film resistor without being short circuited.

In the present embodiment, the piezoelectric unit 10 is configured by the lower electrode 40, the ferroelectric film 11, and the piezoelectric unit upper electrode 50. Further, the piezoelectric unit upper electrode 50 doubles as the lower electrode of the capacitor 20 and the capacitor 20 is configured by this piezoelectric unit upper electrode 50, the dielectric film 22 and the capacitor upper electrode 60.

The composition of the lower electrode 40 is not particularly limited, and includes metal or a metal oxide, such as Au, Pt, Ir, IrO₂, RuO₂, LaNiO₃, and SrRuO₃ and combinations thereof. The composition of the piezoelectric unit upper electrode 50 that doubles as the lower electrode of the capacitor 20 and of the capacitor upper electrode 60 is not particularly limited, and includes the materials exemplified as the lower electrode 40, electrode materials generally used in a semiconductor process, such as Al, Ta, Cr, and Cu, and combinations thereof. The thickness of each of the electrodes 40, 50 and 60 is not particularly limited, and is preferably in the range of 50 to 500 nm. Methods of forming the respective electrodes 40, 50 and 60 are not particularly limited, and it is preferable that a gas-phase film forming method, such as a sputtering method, is used.

As long as the ferroelectric film 11 has asymmetric bipolar polarization-electric field hysteresis characteristics having two coercive electric field points and having different absolute values of two coercive electric fields as shown in FIG. 3, the ferroelectric film 11 is not particularly limited. Suitable composition of the ferroelectric film 11 and a suitable method of forming the ferroelectric film 11 are the same as already described above.

The dielectric film 22 forming the capacitor 20 is not particularly limited, and it is preferable that the dielectric film 22 forming the capacitor 20 maintains constant permittivity as far as possible in a drive voltage region. A SiO₂ film, an HfO₂ film, a ZnO₂ film, a BaTO₃ film, and the like are preferably exemplified as such a dielectric film 22. A method of forming the dielectric film is not particularly limited. A gas-phase film formation method, such as a sputtering method or a chemical vapor deposition (CVD) method, may be used as the method of forming the dielectric film, and a method of firing a precursor after forming a film by spin coating may be used as the method of forming the dielectric film. For example, a method of forming a SiO₂ film at a temperature of about 300° C. by a method, such as TEOS (Tetra Ethyl Ortho Silicate) CVD, is practical.

Since the capacitance $C_s$ of the capacitor 20 is determined depending on the permittivity, the thickness, and the area of a dielectric, the kind, the area, and the thickness of a material may be adjusted to obtain desired capacitance.

The resistor 30 is not particularly limited, and can be appropriately selected according a desired resistance value. It is preferable that a metal, such as Pt or Cu, is used for the resistor 30, and a nonmetal, such as graphite, may be used for the resistor 30. It should be noted that in the present embodiment, the resistor 30 is formed at the same time, and from the same material, as the piezoelectric unit upper electrode 50.

A thin film, such as metal, is patterned in the shown meandering shape so as to have a folded structure, so that the resistor 30 can be realized. Since a resistance value is theoretically determined depending on the resistivity of a material, a cross-sectional area, and a length, the width, the length, and the thickness of a pattern may be adjusted so that a desired resistance value is obtained.

Figure 5A:
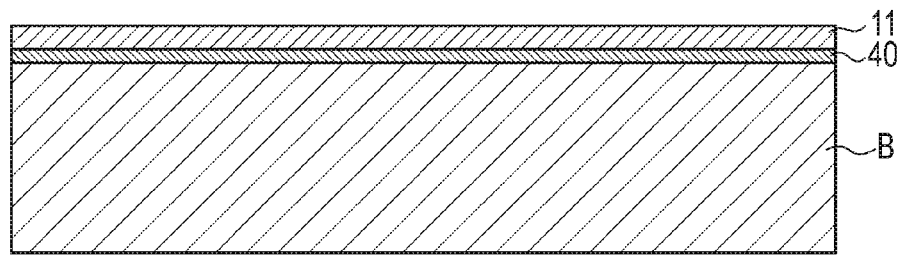
FIG. 5A is a diagram showing a step of manufacturing the piezoelectric element shown in FIGS. 4A and 4B (a step of forming a ferroelectric film).
Figure 5B:
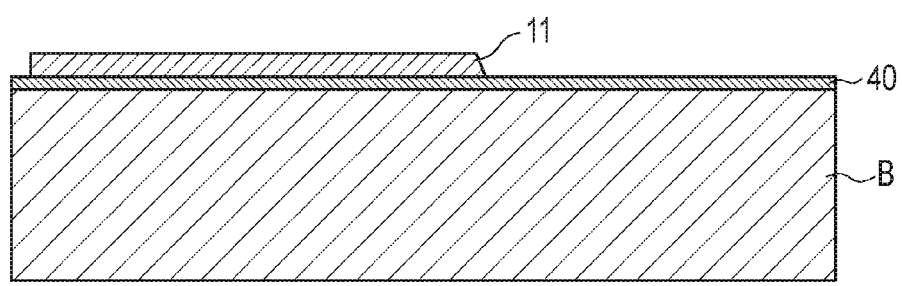
FIG. 5B is a diagram showing a step of manufacturing the piezoelectric element shown in FIGS. 4A and 4B (a step of patterning a ferroelectric film).
Figure 5C:
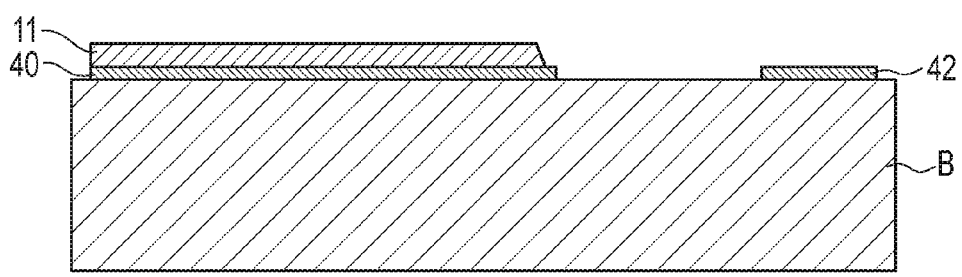
FIG. 5C is a diagram showing a step of manufacturing the piezoelectric element shown in FIGS. 4A and 4B (a step of patterning a lower electrode).
Figure 5D:
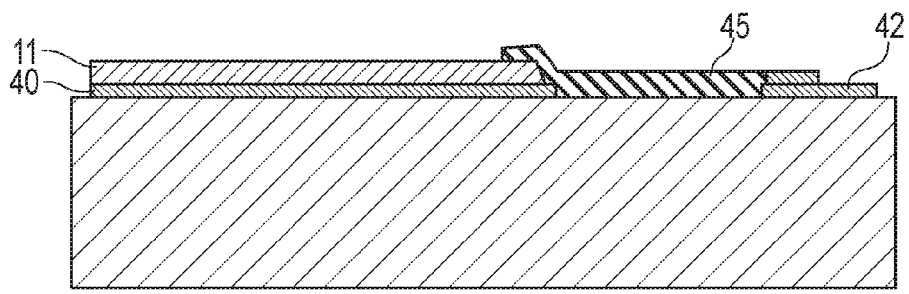
FIG. 5D is a diagram showing a step of manufacturing the piezoelectric element shown in FIGS. 4A and 4B (a step of forming an insulator thin film pattern).
Figure 5E:
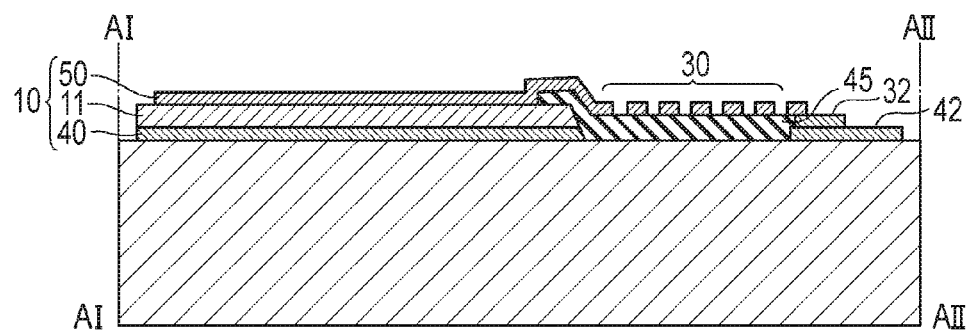
FIG. 5E is a diagram showing a step of manufacturing the piezoelectric element shown in FIGS. 4A and 4B (a step of forming a piezoelectric unit upper electrode and a resistor pattern).

Next, a process for manufacturing the piezoelectric element 2 will be described. First, the lower electrode 40 and the ferroelectric film 11 are formed on the substrate B as shown in FIG. 5A. Then, the ferroelectric film 11 is patterned as shown in FIG. 5B and, subsequently, the lower electrode and the lower electrode pad 42 of the piezoelectric unit are formed by patterning the lower electrode 40 as shown in FIG. 5C. Methods of patterning the ferroelectric film 11 and the lower electrode 40 are not particularly limited, and wet etching or dry etching is preferable. Next, the insulator thin film 45 is formed by patterning as shown in FIG. 5D. The material of the insulator thin film 45 is generally $SiO_2$, $Al_2O_3$ or the like, but is not limited thereto. Then, the piezoelectric unit upper electrode 50, the resistor 30 and the intermediate electrode pad 32 are formed by patterning as shown in FIG. 5E. The intermediate electrode pad 32 is provided in order to connect one end of the resistor 30 to the lower electrode pad 42. Here, the piezoelectric unit upper electrode 50 is formed on the ferroelectric film 11, and the resistor 30 is formed on the insulator thin film 45. By this process, the piezoelectric unit 10, and the resistor 30 that is electrically connected in parallel with this piezoelectric unit 10, are formed. FIG. 5E corresponds to the cross-sectional view along line AI-AII in FIG. 4C.

Figure 5F:
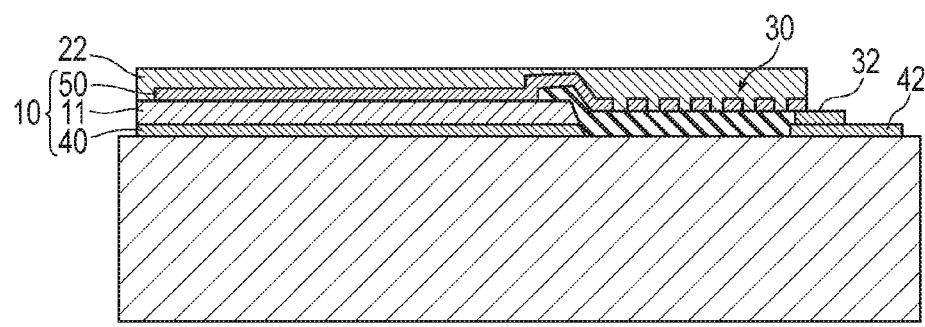
FIG. 5F is a diagram showing a step of manufacturing the piezoelectric element shown in FIGS. 4A and 4B (a step of patterning a dielectric film).

Next, the dielectric film 22 is patterned as shown in FIG. 5F. The method of forming the dielectric film 22 may be a gas-phase film formation method, such as a sputtering method or a chemical vapor deposition (CVD) method, or may be a method of firing a precursor after forming a film by spin coating. For example, a method of forming a $SiO_2$ film at a temperature of about 300° C. by a method, such as TEOS-CVD, is practical. The method of patterning the dielectric film 22 is not particularly limited, and wet etching or dry etching is preferable, similarly to the patterning of the ferroelectric film 11.

Figure 5G:
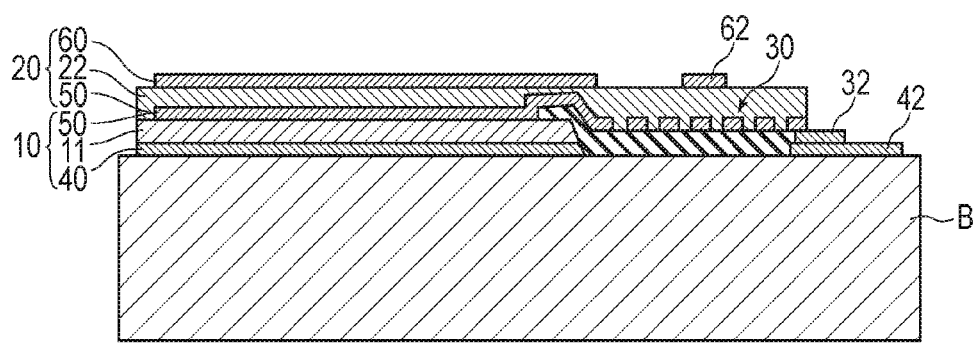
FIG. 5G is a diagram showing a step of manufacturing the piezoelectric element shown in FIGS. 4A and 4B (a step of patterning an upper electrode).

Next, the capacitor upper electrode 60 and the upper electrode pad 62 are formed by patterning as shown in FIG. 5G. A lift-off method and wet etching are preferably exemplified as these methods of patterning. As a result of this, the capacitor 20, which is formed from the piezoelectric unit upper electrode 50, the dielectric film 22 and the capacitor upper electrode 60, is formed electrically in series with the piezoelectric unit 10. Finally, an actuator portion is released from the back of the substrate B by wet etching or anisotropic dry etching, such as Bosch process, to be displaceable, so that the piezoelectric element 2 shown in FIG. 4B can be formed in a lump.

(Change in Design)

The invention is not limited to the embodiment and can appropriately change in design without departing from the scope of the invention. For example, an aspect in which the capacitor 20 is connected between the drive unit 3 and the piezoelectric unit 10 has been described in the above-mentioned embodiment, but the same effect is obtained even though the capacitor 20 is connected between a ground potential and the piezoelectric unit 10.

EXAMPLES

Example 1 and Comparative Example 1

Ti having a thickness of 30 nm and an Ir electrode (the lower electrode 40) having a thickness of 150 nm were formed on an Si substrate (the substrate B) having a thickness of 350 μm at a substrate temperature of 350° C. by a sputtering method. Next, a Nb-doped PZT film (Nb-PZT film) as the ferroelectric film 11, having a thickness of 3 μm was formed on the Ir electrode by an RF sputtering device under the conditions of a degree of vacuum of 0.3 Pa, an $Ar/O_2$ mixed atmosphere ($O_2$ volume fraction of 7%), a film forming temperature of 550° C., and supplied power of 3 kW. At this time, a PZT target having morphotropic phase boundary (MPB) composition (that is, a molar ratio of Zr/Ti is substantially equal to 52/48) in which 12 mole % of Nb was doped in the B site was used.

Figure 6:
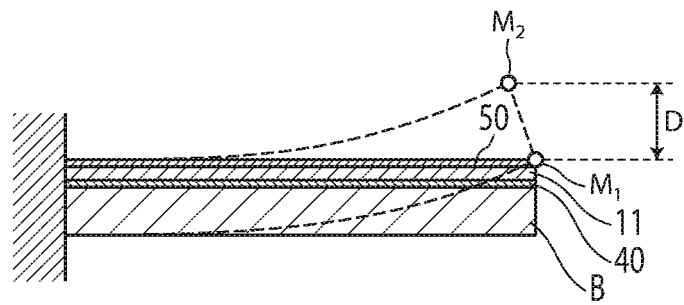
FIG. 6 is a schematic cross-sectional view showing the structure of a cantilever produced by Example and Comparative Example.

Next, after an Ir upper electrode (the piezoelectric unit upper electrode 50) was formed on the Nb-PZT film by a sputtering method, patterning was performed by lift-off and a piezoelectric unit having a cantilever structure shown in FIG. 6 was produced by a dicing process. The width of a cantilever was set to 2 mm and the length of the cantilever was set to about 25 mm.

Figure 7:
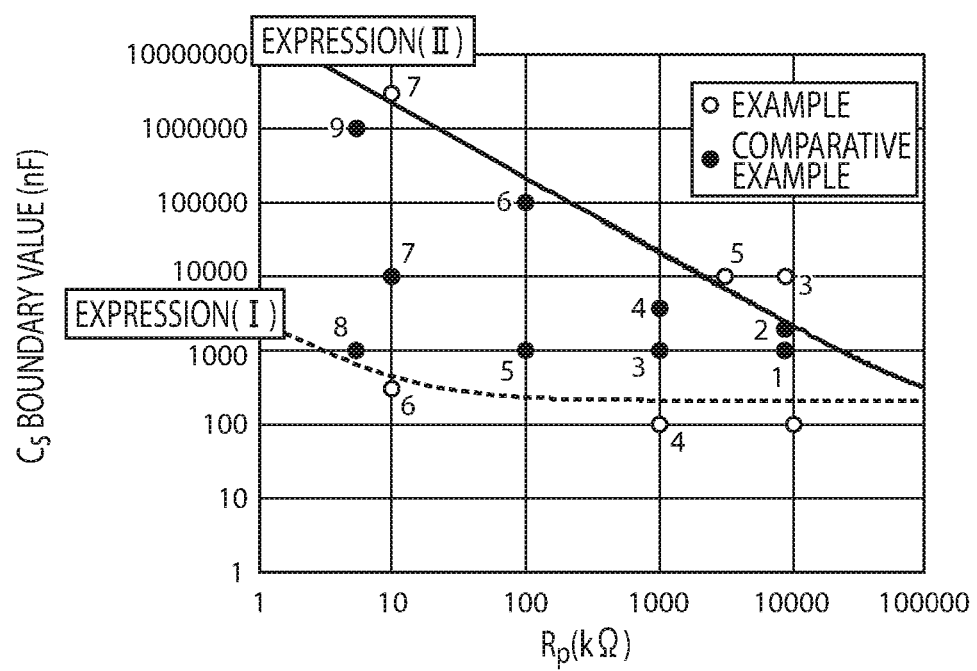
FIG. 7 is a diagram showing the range of the capacitance of a capacitor and combined resistance $R_p$ satisfying Expression I and Expression II in a case in which the capacitance of a ferroelectric is 140 nF and a driving frequency is 100 Hz.
Figure 8:
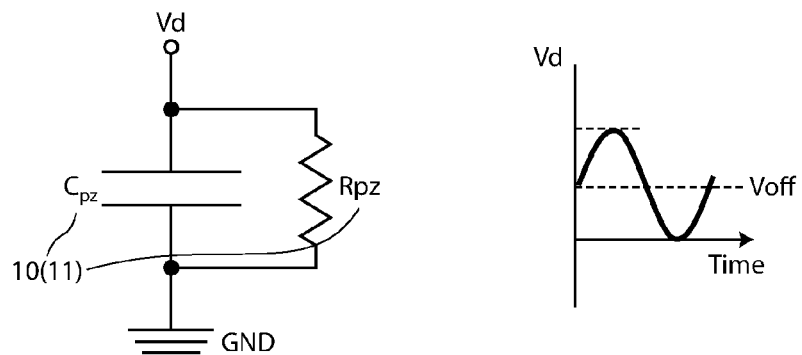
FIG. 8 is an equivalent circuit diagram showing the configuration of a piezoelectric actuator of Comparative Example.

Next, a capacitor having capacitance Cs was connected to the piezoelectric unit in series, a resistor having a resistance value Rex was connected to the capacitor in series and was inserted to be connected to the piezoelectric unit in parallel, so that the piezoelectric actuator of the examples of the invention was produced. The capacitance $C_{pz}$ of the piezoelectric unit was measured as 140 nF. Further, likewise, the resistance value of the piezoelectric unit was measured as a value in the range of about 20 GΩ to 50 GΩ. Since this value is larger than the resistance value Rex of the resistor inserted from the outside 1000 or more times, the combined resistance $R_p$ can be approximate to Rex in this example. In the piezoelectric actuator of the invention, a value between a curve satisfying Expression I of FIG. 7 and a straight line satisfying Expression II needs to be selected as the capacitance $C_s$ and the combined resistance $R_p$. FIG. 7 is a diagram showing the range of the capacitance of a capacitor and the combined resistance $R_p$ satisfying Expression I and Expression II in a case in which the capacitance of a ferroelectric is 140 nF and a driving frequency is 100 Hz. In Example 1, the capacitor and the resistor were selected so that $C_s$ was 1.0 μF and $R_p$ was 9.0 MΩ. The piezoelectric actuator having a cantilever structure functions as a piezoelectric-thin-film-unimorph actuator that is deformed so as to be bent up and down in a case in which a voltage is applied between the upper and lower electrodes of the ferroelectric (piezoelectric body). Further, likewise, a piezoelectric actuator of which a capacitor and a resistor are not inserted and an equivalent circuit has an aspect shown in FIG. 8 was produced Comparative Example 1.

A positive-polarity-unipolar sine wave having a driving frequency of 100 Hz was input to the piezoelectric actuators of Example 1 and Comparative Example 1, which were produced in this way, and the displacement rate of an end ($M_1$ and $M_2$ in FIG. 6) of the cantilever was measured by a laser Doppler vibrometer (hereinafter, abbreviated as an LDV). The maximum value of the amount D of displacement of the end of the cantilever was calculated from the displacement rate and the driving frequency.

Next, the bipolar P-E hysteresis of the piezoelectric actuator was measured, and a ratio $P(Ec_1)/P(0)$ of "gradient $P(Ec_1)=\partial P/\partial E_{E=Ec1}$" of the coercive electric field $Ec_1$ to "gradient $P(0)=\partial P/\partial E_{E=0}$", which was obtained in a case in which an electric field is 0 V/km, was calculated.

The maximum amount of displacement that is obtained, a drive voltage that is obtained at the time of the maximum displacement, time $t_s$ that is taken until the amount of displacement is stabilized, a ratio of the gradients, and a displacement deterioration rate during long-term driving are shown in Table 1. In Example and Comparative Example, "the maximum amount of displacement" means the amount of displacement that is obtained in a case in which the amount of reverse polarization domain in a ferroelectric reaches a certain fixed amount, and was set to a value that is determined by the following method. The distortion of an output speed waveform caused by polarization reversal was determined by the monitoring of the amount of harmonic component of a fundamental wave; and the maximum amount of displacement, which is obtained in a range in which a secondary harmonic component (a component having a frequency of 200 Hz in this example) of an output speed waveform of the piezoelectric actuator is 7% or less of the fundamental wave (a component having a frequency of 100 Hz), was defined as the maximum amount of displacement of the piezoelectric actuator.

Further, the time $t_s$, which is taken until the amount of displacement is stabilized, was defined as time that is taken until a difference between the intensity I of a speed output waveform of the LDV and intensity Is (=stable speed amount), which is obtained in a case in which infinite time has passed (t=∞), becomes 10% or less of Is. Although the time, which is taken until the amount of displacement is stabilized, also depends on the type of device, it is preferable that the time is 15 seconds or less and it is more preferable that the time is 10 seconds or less.

A displacement deterioration rate during long-term driving was evaluated as a displacement deterioration rate that is obtained after the piezoelectric actuator is driven for 10 hours with a voltage where the maximum amount of displacement of the piezoelectric actuator is obtained. Generally, the amount of displacement of an actuator device is always monitored by a displacement sensor, and a drive voltage of the actuator device is adjusted by an automatic gain control (AGC) circuit or the like so that the displacement of the actuator device is maintained constant. However, since displacement exceeds a correctable range on a circuit side in a case in which the amount of displacement deterioration becomes larger than a predetermined amount, it is difficult to maintain displacement constant or a more expensive correction circuit is required. For this reason, it is not preferable that the amount of displacement deterioration becomes larger than a predetermined amount. Considering this perspective, it is preferable that a displacement deterioration rate during long-term driving is smaller than 10% and it is more preferable that a displacement deterioration rate during long-term driving is smaller than 5%.

Figure 9:
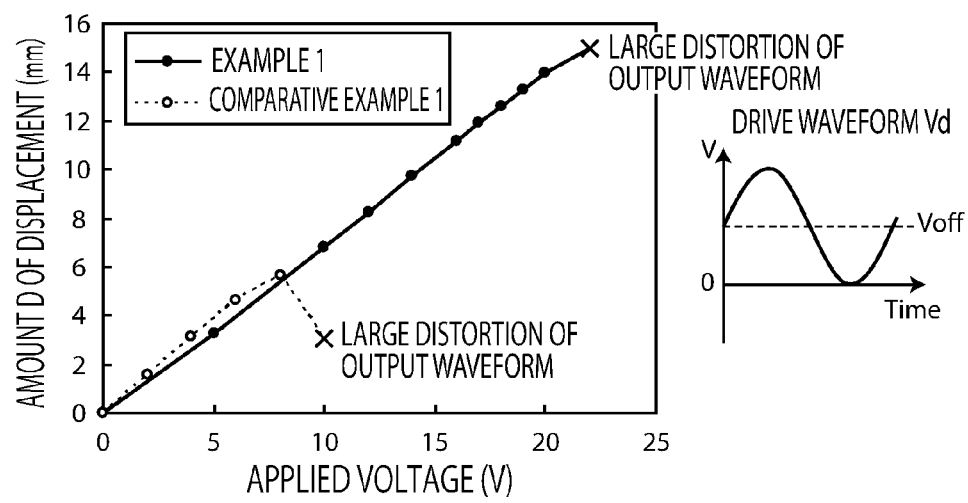
FIG. 9 is a diagram showing a relationship between a drive voltage and the amount of displacement in a case in which the piezoelectric actuator is driven with a positive-polarity-unipolar sine wave (Example 1 and Comparative Example 1).

A relationship between a voltage and the amount of displacement, which is obtained in a case in which the piezoelectric actuator is driven with a unipolar sine wave having a positive polarity, is shown in FIG. 9. As shown in FIG. 9, it was confirmed in Comparative Example 1 that a speed output waveform was rapidly distorted at a spot where an applied voltage exceeds 8V and the amount of displacement was reduced. The distortion of a waveform and a reduction in the amount of displacement mean that the polarization reversal of a piezoelectric body is caused. On the other hand, in Example 1 where $C_s$ was 1 μF and $R_p$ was 9 MΩ, the distortion of the waveform of a displacement rate caused by polarization reversal and a reduction in the amount of displacement were not confirmed in an amplitude domain of a voltage of 20.2 V or less, but the distortion of a speed waveform was gently increased with a voltage rise and an increase in the amount of displacement become slow in a case in which the piezoelectric actuator was driven with a voltage higher than 20.2 V.

As shown in FIG. 9, since the capacitor is connected to the piezoelectric unit in series and the resistor is connected to the piezoelectric unit in parallel, it is possible to prevent polarization reversal up to a voltage amplitude two times or more Comparative Example 1 even though the piezoelectric actuator is driven with a unipolar voltage waveform having a polarity opposite to a polarization direction of Nb-doped PZT. As a result, it is possible to take out the large displacement of the actuator. According to the piezoelectric actuator of the invention that is adapted so that the capacitor connected in series can be charged with DC components of a drive waveform, it could be confirmed that a voltage applied to the Nb-doped PZT film is converted into a bipolar waveform of an offset voltage of 0 and large displacement and long-term stability can be compatible in the piezoelectric actuator including a ferroelectric having polarization opposite to the polarity of a drive waveform.

Comparative Example 2

Figure 10:
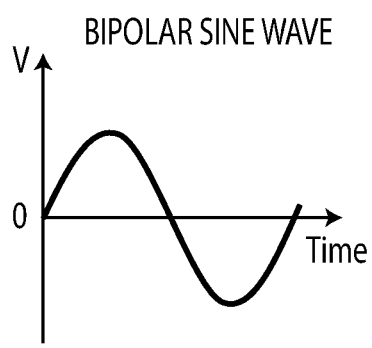
FIG. 10 is a schematic diagram of a drive waveform used in Comparative Example 2.

A piezoelectric actuator was produced and evaluated in the same manner as Comparative Example 1 except that a bipolar sine wave shown in FIG. 10, which is not offset, is input as a drive waveform. The evaluation results of the piezoelectric actuator are shown in Table 1. Since the driving using a bipolar sine wave is the same as Example 1, the same displacement as Example 1 was obtained as the maximum amount of displacement but a displacement deterioration rate during long-term driving was 22% that is larger than Example 1 10 or more times. The reason for this is considered that polarization reversal near a coercive electric field is gradually caused since impedance (a capacitor in Example 1) connected to a piezoelectric unit in series is not present in Comparative Example 2 and a drive voltage close to the coercive electric field is applied to obtain the maximum amount of displacement. In a case in which a capacitor and a resistor are connected in the structure of Comparative Example 2 as in Example 1 to form the piezoelectric actuator of the invention, a voltage applied to the ferroelectric is suppressed near a coercive electric field and an effect of suppressing depolarization is obtained. As a result, long-term drive stability can be obtained.

Examples 2 to 9 and Comparative Examples 3 to 7

Piezoelectric actuators of Examples 2 to 9 and Comparative Examples 3 to 7 were produced and evaluated in the same manner as Example 1 except that the capacitance of a capacitor and the value of combined resistance are combined as shown in FIG. 7. The evaluation results of the respective examples are shown in Table 1.

Comparative Examples 3, 5, and 7 correspond to combinations of a combined resistance value and capacitance not satisfying Expression II. It was also confirmed from the obtained results that time, which is taken until displacement is stabilized, is longer than 15 seconds and the adequacy of devices are inferior. Comparative Examples 4 and 6 correspond to combinations of a combined resistance value and capacitance not satisfying Expression I. It was also confirmed from the obtained results that a high voltage exceeding 30 V is required as a drive voltage used to obtain the maximum amount of displacement.

Examples 10 and 11 and Comparative Example 8

Piezoelectric actuators of Examples 10 and 11 and Comparative Example 8 were produced and evaluated in the same manner as Example 1 except that the composition of a target used to form a ferroelectric film is changed. Specifically, a PZT target having MPB composition in which 25 mole % of Nb was doped in the B site was used in Example 10, a PZT target having MPB composition in which 6 mole % of Nb was doped in the B site was used in Example 11, and a PZT target having MPB composition in which Nb was not doped in the B site was used in Comparative Example 8. The evaluation results of the respective examples are shown in Table 1.

It was confirmed from Examples 10 and 11 and Comparative Example 8 that a ratio of the gradient of the coercive electric field of P-E hysteresis to a gradient, which is obtained In a case in which an electric field is 0 V/km, is changed according to the amount of Nb to be doped. In Example 11 in which a ratio in the gradient is 6.5, a displacement deterioration rate during long-term driving was 3.1, that is, stability was excellent. However, in Comparative Example 8 in which a ratio in the gradient is 2.2, the maximum amount of displacement was small, that is, 7.5 μm and a displacement deterioration rate during long-term driving was relatively high, that is, 10%. It was confirmed from these results that an effect of suppressing depolarization near the coercive electric field can be improved since capacitance near a coercive electric field becomes significantly large in a case in which a ferroelectric has P-E hysteresis having high squareness.

It was confirmed from the above description that the piezoelectric actuator of the invention is suitable to be applied to a device since a voltage used to obtain the maximum displacement is low, that is, in the range of about 18 to 20 V and time, which is taken until the amount of displacement is stabilized, is short, that is, 15 seconds or less.

TABLE 1

|  | THE AMOUNT OF Nb IN B-SITE ELEMENT | $P(Ec_1)/P(0)$ | Rp (MΩ) | Cs (μF) | DRIVE WAVEFORM | DRIVING FREQUENCY (Hz) |
|---|---|---|---|---|---|---|
| EXAMPLE 1 | 12 mol % | 10.7 | 9.000 | 1.0 | +OFFSET SINE WAVE | 100 |
| EXAMPLE 2 | 12 mol % | 10.7 | 9.000 | 2.2 | +OFFSET SINE WAVE | 100 |
| EXAMPLE 3 | 12 mol % | 10.7 | 1.000 | 1.0 | +OFFSET SINE WAVE | 100 |
| EXAMPLE 4 | 12 mol % | 10.7 | 1.000 | 3.6 | +OFFSET SINE WAVE | 100 |
| EXAMPLE 5 | 12 mol % | 10.7 | 0.100 | 1.0 | +OFFSET SINE WAVE | 100 |
| EXAMPLE 6 | 12 mol % | 10.7 | 0.100 | 100 | +OFFSET SINE WAVE | 100 |
| EXAMPLE 7 | 12 mol % | 10.7 | 0.010 | 10.0 | +OFFSET SINE WAVE | 100 |
| EXAMPLE 8 | 12 mol % | 10.7 | 0.005 | 1.0 | +OFFSET SINE WAVE | 100 |
| EXAMPLE 9 | 12 mol % | 10.7 | 0.005 | 1000 | +OFFSET SINE WAVE | 100 |
| EXAMPLE 10 | 25 mol % | 8.0 | 0.100 | 1.0 | +OFFSET SINE WAVE | 100 |
| EXAMPLE 11 | 6 mol % | 6.5 | 0.100 | 1.0 | +OFFSET SINE WAVE | 100 |
| COMPARTIVE EXAMPLE 1 | 12 mol % | 10.7 | None | None | +OFFSET SINE WAVE | 100 |
| COMPARATIVE EXAMPLE 2 | 12 mol % | 10.7 | None | None | BIPOLAR SINE WAVE | 100 |
| COMPARATIVE EXAMPLE 3 | 12 mol % | 10.7 | 9.000 | 10.0 | +OFFSET SINE WAVE | 100 |
| COMPARATIVE EXAMPLE 4 | 12 mol % | 10.7 | 1.000 | 0.1 | +OFFSET SINE WAVE | 100 |
| COMPARATIVE EXAMPLE 5 | 12 mol % | 10.7 | 3.000 | 10.0 | +OFFSET SINE WAVE | 100 |
| COMPARATIVE EXAMPLE 6 | 12 mol % | 10.7 | 0.010 | 0.3 | +OFFSET SINE WAVE | 100 |
| COMPARATIVE EXAMPLE 7 | 12 mol % | 10.7 | 0.010 | 3000 | +OFFSET SINE WAVE | 100 |
| COMPARATIVE EXAMPLE 8 | 0 mol % | 2.2 | 0.100 | 1.0 | +OFFSET SINE WAVE | 100 |

|  | THE MAXIMUM AMOUNT OF DISPLACEMENT (μM) | DRIVE VOLTAGE AT THE TIME OF MAXIMUM DISPLACEMENT (V) | TIME $t_s$ TAKEN UNTIL STABILIZATION OF DISPLACEMENT (s) | DISPLACEMENT DETERIORATION RATE DURING LONG-TERM DRIVING (%) |
|---|---|---|---|---|
| EXAMPLE 1 | 14.0 | 20.2 | 5.8 | 2.0 |
| EXAMPLE 2 | 14.2 | 18.9 | 13.0 | 2.1 |
| EXAMPLE 3 | 14.0 | 20.3 | 0.6 | 2.2 |
| EXAMPLE 4 | 14.1 | 18.4 | 2.4 | 3.5 |
| EXAMPLE 5 | 14.0 | 20.5 | 0.1 | 1.5 |
| EXAMPLE 6 | 14.0 | 17.8 | 6.9 | 4.0 |
| EXAMPLE 7 | 14.1 | 18.5 | 0.1 | 5.0 |

TABLE 1-continued

| | | | | |
|---|---|---|---|---|
| EXAMPLE 8 | 14.1 | 26.5 | 0.1 | 2.0 |
| EXAMPLE 9 | 14.2 | 18.0 | 3.8 | 5.5 |
| EXAMPLE 10 | 14.9 | 16.2 | 2.0 | 4.5 |
| EXAMPLE 11 | 11.2 | 22.0 | 0.2 | 3.1 |
| COMPARTIVE EXAMPLE 1 | 5.6 | 8.0 | — | NOT PERFORMED |
| COMPARATIVE EXAMPLE 2 | 14.0 | 17.9 | — | 22.0 |
| COMPARATIVE EXAMPLE 3 | 14.3 | 18.0 | 62.0 | 5.2 |
| COMPARATIVE EXAMPLE 4 | 14.1 | 43.0 | 0.3 | 1.3 |
| COMPARATIVE EXAMPLE 5 | 14.2 | 18.0 | 21.0 | 5.1 |
| COMPARATIVE EXAMPLE 6 | 14.1 | 35.7 | 0.1 | 1.5 |
| COMPARATIVE EXAMPLE 7 | 14.2 | 18.0 | 25.0 | 10.2 |
| COMPARATIVE EXAMPLE 8 | 7.5 | 17.0 | 4.0 | 10.0 |

The piezoelectric actuator of the invention can be preferably applied to a piezoelectric element/a piezoelectric ultrasonic vibrator/a piezoelectric power generating element, and the like that are mounted on an ink jet recording head, a magnetic recording/reproducing head, a micro electro-mechanical system (MEMS) device, a micropump, an ultrasound probe, an ultrasonic motor, and the like, or a ferroelectric element, such as a ferroelectric memory.

EXPLANATION OF REFERENCES

1: piezoelectric actuator
2: piezoelectric element
10: piezoelectric unit
11: ferroelectric
20: capacitor
30: resistor
40: lower electrode
50: piezoelectric unit upper electrode
B: substrate
3: drive unit
Vd: drive waveform

What is claimed is:
1. A piezoelectric actuator comprising:
a piezoelectric element that includes a piezoelectric unit including a ferroelectric, which has asymmetric bipolar polarization-electric field hysteresis characteristics having two coercive electric field points and having different absolute values of the two coercive electric fields, a capacitor electrically connected to the piezoelectric unit in series, and a resistor electrically connected to the capacitor in series and electrically connected to the ferroelectric in parallel; and
a drive unit that inputs a drive waveform, which includes a DC offset component of which polarity is opposite to polarization of the ferroelectric, to the piezoelectric element to drive the piezoelectric element,
wherein, of the two coercive electric fields, a value of a coercive electric field $Ec_1$, of which an absolute value is larger, and a value of a coercive electric field $Ec_2$, of which an absolute value is smaller, satisfy the following Expression I, and
wherein capacitance $C_s$ of the capacitor, capacitance $C_{pz}$ of the ferroelectric, combined resistance $R_p$ of resistance of the resistor and resistance of the ferroelectric, and a fundamental angular frequency $\omega$ of the drive waveform satisfy the following Expression II and Expression III:

$$1/3 \leq |Ec_1 + Ec_2|/|Ec_1 - Ec_2| \quad \text{(Expression I)}$$

$$C_s \geq 1.5\left(C_{pz} + \frac{1}{\omega R_p}\right) \quad \text{(Expression II)}$$

$$R_p \geq -\frac{15}{C_s + C_{pz}} \cdot \frac{1}{\ln\left(\frac{0.5(C_s + C_{pz})}{C_s}\right)}. \quad \text{(Expression III)}$$

2. The piezoelectric actuator according to claim 1, wherein the polarity of the coercive electric field of which the absolute value is larger is positive.
3. The piezoelectric actuator according to claim 1, wherein the ferroelectric is a thin film formed on a substrate.
4. The piezoelectric actuator according to claim 3, wherein the ferroelectric is a thin film that is formed on the substrate by a sputtering method using plasma.
5. The piezoelectric actuator according to claim 1, wherein the ferroelectric is spontaneously polarized immediately after the formation of the film.
6. The piezoelectric actuator according to claim 1, wherein the ferroelectric is one or two or more kinds of perovskite oxides expressed by the following General Formula P1:

$$ABO_3 \quad \text{(General Formula P1)}$$

wherein, in General Formula P1, A is an A-site element including at least one kind of an element selected from the group consisting of Pb, Ba, Sr, Bi, Li, Na, Ca, Cd, Mg, K, and a lanthanide element, and B is a B-site element including at least one kind of an element selected from the group consisting of Ti, Zr, V, Nb, Ta, Sb, Cr, Mo, W, Mn, Mg, Sc, Co, Cu, In, Sn, Ga, Zn, Cd, Fe, Ni, Hf, and Al.
7. The piezoelectric actuator according to claim 6, wherein the ferroelectric is one or two or more kinds of perovskite oxides expressed by the following General Formula P2:

$$A(Zr_x,Ti_y,M_{1-x-y})O_3 \quad \text{(General Formula P2)}$$

wherein, in General Formula P2, A is an A-site element including Pb as a main component, M is a B-site element including at least one kind of an element selected from the group consisting of V, Nb, Ta, Sb, Cr, Mo, W, Mn, Mg, Sc, Co, Cu, In, Sn, Ga, Zn, Cd, Fe, Ni, Hf, and Al, and "0<x<1" and "0<y<1" are satisfied.

8. The piezoelectric actuator according to claim 7, wherein the M in General Formula P2 includes Nb and a molar ratio of Nb in the B-site element is in the range of 0.06 to 0.40.

9. The piezoelectric actuator according to claim 1, wherein, in the bipolar polarization-electric field hysteresis of the ferroelectric, a gradient $\partial P/\partial E_{E=Ec1}$ of the coercive electric field $Ec_1$ and a gradient $\partial P/\partial E_{E=0}$, which is obtained in a case in which electric field intensity is 0 V/cm, satisfy the following Expression IV:

$$6.5 \leq \left(\frac{\partial P}{\partial E_{E=Ec1}}\right) / \left(\frac{\partial P}{\partial E_{E=0}}\right). \quad \text{(Expression IV)}$$

* * * * *